United States Patent [19]
Sakamoto et al.

[11] Patent Number: 5,376,802
[45] Date of Patent: Dec. 27, 1994

[54] STENCIL MASK AND CHARGE PARTICLE BEAM EXPOSURE METHOD AND APPARATUS USING THE STENCIL MASK

[75] Inventors: Kiichi Sakamoto, Tokyo; Yasushi Takahashi; Yoshihisa Oae, both of Kawasaki; Hiroshi Yasuda, Yokohama, all of Japan

[73] Assignee: Fujitsu Limited, Kawasaki, Japan

[21] Appl. No.: 62,573

[22] Filed: May 18, 1993

Related U.S. Application Data

[62] Division of Ser. No. 718,433, Jun. 20, 1991, Pat. No. 5,288,567.

[30] Foreign Application Priority Data

Jun. 27, 1990 [JP] Japan .................................. 2-171001

[51] Int. Cl.⁵ .............................................. H01J 37/30
[52] U.S. Cl. ............................ 250/492.23; 250/398
[58] Field of Search ........................... 259/398, 492.23

[56] References Cited

U.S. PATENT DOCUMENTS

| | | | |
|---|---|---|---|
| 5,036,209 | 7/1991 | Kataoka et al. | 250/492.2 |
| 5,099,133 | 3/1992 | Yamada | 250/492.2 |
| 5,144,142 | 9/1992 | Fueki et al. | 250/398 |

FOREIGN PATENT DOCUMENTS

| | | |
|---|---|---|
| 52-119185 | 6/1977 | Japan . |
| 56-19402 | 5/1981 | Japan . |
| 62-260322 | 11/1987 | Japan . |

*Primary Examiner*—Bruce C. Anderson
*Attorney, Agent, or Firm*—Staas & Halsey

[57] ABSTRACT

A stencil mask is used for exposing a pattern on a wafer using a charged particle beam which is transmitted through the stencil mask. The stencil mask is made up of a plate, and at least a block pattern region formed on the plate. The block pattern region includes apertures of arbitrary shapes for transmitting the charged particle beam which irradiates the apertures within the block pattern region in one shot of the charged particle beam. The block pattern region forms a block mask in which a pair of confronting blanking electrodes is provided with respect to at least predetermined ones of the apertures.

5 Claims, 12 Drawing Sheets

STENCIL MASK AND CHARGE PARTICLE BEAM EXPOSURE METHOD AND APPARATUS USING THE STENCIL MASK

This application is a division of application Ser. No. 07/718,433, filed Jun. 20, 1992, now U.S. Pat. No. 5,885,000.

BACKGROUND OF THE INVENTION

The present invention generally relates to stencil masks and charged particle beam exposure methods and apparatuses, and more particularly to a stencil mask having blanking electrodes and charged particle beam exposure method and apparatus which expose patterns using such a stencil mask.

Recently, the integration density of integrated circuit devices is becoming more and more improved. As a result, the photolithography technique which was conventionally used for forming patterns is being replaced by charged particle beam exposure methods, X-ray exposure methods and the like. The electron beam exposure method in particular is one of the promising charged particle beam exposure methods because fine patterns on the order of microns or even less can be formed by use of the electron beam.

The resolution of the electron beam exposure is high and fine patterns can be formed using the electron beam exposure method. However, there is a limit to the processing capability of the electron beam exposure method because the patterns are drawn by the stroke of the electron beam.

Various proposals have been made to improve the processing capability of the electron beam exposure method. For example, there is a proposed method which forms in advance sequences for generating patterns such as rectangular, square and triangular patterns using a variable rectangular aperture and selecting one of the sequences to irradiate and expose a desired pattern. A Japanese Laid-Open Patent Application No. 52-119185 proposes an exposure method using a mask in which the patterns are arranged in blocks. On the other hand, a Japanese Laid-Open Patent Application No. 62-260322 proposes an exposure method using a plate which includes rectangular apertures for forming general rectangular patterns and apertures for forming repeating patterns which are required to form a memory cell or the like.

The method of forming the repeating patterns is also referred to as a block exposure method or a cell production method, and is an effective method when forming a device such as a memory in which the repeating patterns occupy a large portion of the area to be exposed. Suitable ones of the repeating patterns are formed as block patterns, and one block pattern region is selected. The charged particle beam is irradiated on the selected block pattern region, and the charged particle beam transmitted through the selected block pattern region is repeatedly irradiated at desired positions on a wafer.

FIG. 1 generally shows an example of an electron beam exposure apparatus which performs the block process. The electron beam exposure apparatus is made up of an exposure part 10 and a control part 50. The exposure part 10 includes a charged particle beam generating source 14, a first slit 15, a first electron lens 16, a slit deflector 17, second and third lenses 18 and 19, a transmission (stencil) mask 20, first through fourth deflectors 21 through 24, blanking electrodes 25, a fourth lens 26, an aperture 27, a refocusing coil 28, a fifth lens 29, a dynamic focusing coil 30, a dynamic stigmator coil (i.e., an astigmatic correction coil) 31, a sixth lens 32, electromagnetic main deflection coils 33, electrostatic sub deflection means 34, a stage 35, and first through fourth alignment coils 36 through 39.

The charged particle beam generating source 14 includes a cathode electrode 11, a grid electrode 12 and an anode electrode 13. The first slit 15 forms the cross section of the charged particle beam into a rectangular shape, for example, and the first electron lens 16 converges the shaped charged particle beam. The slit deflector 17 deflects and corrects the beam position depending on a correction deflection signal S1. The second and third lenses 18 and 19 confront each other, and the stencil mask 20 is arranged between the second and third lenses 18 and 19 and is movable in the horizontal direction.

The first through fourth deflectors 21 through 24 are arranged above and below the stencil mask 20 and deflect the beam between the second and third lenses 18 and 19, depending on respective position information P1 through P4, so as to select one of the transmission holes formed in the stencil mask 20. The blanking electrodes 25 block or transmit the beam depending on a blanking signal SB. The electromagnetic main deflection coils 33 and the electrostatic sub deflection means 34 position the beam on a wafer W which is placed on the stage 35 depending on exposure position determination signals S2 and S3. The stage 35 is movable in the X and Y directions.

On the other hand, the control part includes a recording medium, a central processing unit (CPU) 52, an interface 53, a data memory 54, a pattern controller 55, an amplifier part 56, a mask moving mechanism 57, a blanking control circuit 58, an amplifier part 59, a sequence controller 60, a stage control mechanism 61, a laser interferometric device 62, a deflection control circuit 63, and amplifier parts 64 and 65.

The recording medium 51 stores design data related to integrated circuit devices. The CPU 52 controls the entire exposure apparatus. The interface 53 transfers various information which are entered by the CPU 52, such as drawing pattern information related to a pattern which is to be drawn, drawing position information related to a position on the wafer W where the pattern is to be drawn and mask information related to the stencil mask 20. The data memory 54 stores the drawing pattern information and the mask information which are transferred from the interface 53.

The pattern controller 55 functions as a specifying means, a holding means, a calculation means and an output means for carrying out various processes. For example, the pattern controller 55 specifies one of the transmission holes of the stencil mask 20, depending on the drawing pattern information and the mask information, and generates position data indicative of a position of the specified transmission hole on the stencil mask 20. In addition, the pattern controller 55 calculates a correction value H which is dependent on the difference between the respective shapes of the pattern which is to be drawn and the specified transmission hole.

The amplifier part 56 generates the correction deflection signal S1 from the correction value H. The mask moving mechanism 57 moves the stencil mask 20, if necessary, in response to a move signal MS from the pattern controller 55. The blanking control circuit 58 receives a blanking control signal BL from the pattern controller 55, and the amplifier part 59 generates the blanking signal SB based on an output signal of the blanking control circuit 58. The sequence controller 60 controls the drawing process sequence depending on the drawing position information which is transferred from the interface 53. The stage control mechanism 61 moves the stage 35 if necessary. The laser interferometric device 62 detects the position of the stage 35. The deflection control circuit 63 calculates an exposure position on the wafer W. The amplifier parts 64 and 65 respectively generate the exposure position determination signals S2 and S3.

For example, the stencil mask 20 is made of a silicon wafer. FIG. 2 is a plan view showing a mask part of the stencil mask 20.

As shown in FIG. 2, a plurality of areas are formed in a matrix arrangement at predetermined intervals on the stencil mask 20. In the example shown, nine areas E1 through E9 are formed in a matrix arrangement on the stencil mask 20 at a predetermined pitch EL. Each of the areas E1 in each of the X- and Y- directions, or coordinates through E9 has a size corresponding to a maximum deflection range of the beam on the stencil mask 20, and each side of one square area is of a common value, selected from the range of approximately 1 to 5 mm. In other words, when the beam is irradiated within the area E1, for example, the beam can be deflected within the area E1 using the deflectors 21 through 24, but the stencil mask 20 must be moved if the beam is to be irradiated within the area E9, for example. A reference point is located at the left bottom corner of each of the areas E1 through E9 as indicated by a black circular mark, and XY coordinate values are assigned to the reference point of each area. For example, an area coordinate $E_{xy}=(1, 1)$ describes the area E7.

As shown in FIG. 3, a plurality of blocks are formed in a matrix arrangement at predetermined intervals within each of the areas E1 through E9. In the example shown, thirty-six blocks $B_1$ through $B_{36}$ are formed in a matrix arrangement at a predetermined pitch BL within the area E1. The size of one block corresponds to the size of the beam on the stencil mask 20, that is, the cross section of the beam on the stencil mask 20. For example, each side of one square block is of a common value, selected from the range of approximately 100 to 500 μm. The XY coordinate values are also assigned to a reference point of each block. For example, a block coordinate $B_{xy}=(1, 2)$ describes the block $B_{32}$.

In other words, an arbitrary block within an arbitrary area within the stencil mask 20 can be described by the area coordinate $E_{xy}$ and the block coordinate $B_{xy}$. When $E_{xy}=(1, 1)$ and $B_{xy}=(1, 2)$, for example, the block $B_{32}$ within the area E7 is specified. In order to carry out the exposure efficiently, it is desirable that all of the patterns required to expose one layer of one particular kind of large scale integrated circuit (LSI) are formed within one area of the stencil mask 20. In FIG. 3, the blocks $B_1$, $B_6$, $B_{31}$ and $B_{36}$ which are indicated by hatchings denote transmission holes which are used when forming variable rectangular patterns.

FIG. 4 shows an example of contact hole patterns of a dynamic random access memory (DRAM). A plurality of memory elements are distributed in the DRAM, and the contact holes are arranged in correspondence with each of the memory elements as shown. When a region surrounded by a solid line 71 is regarded as a block, for example, it is possible to expose the contact hole patterns of the DRAM which are distributed on a plane by repeating the exposure of the block pattern. In the example shown, thirty contact holes are included in one block, and the entire region can be exposed by carrying out the exposure a number of times equal to 1/30th of the number of memory elements. In other words, the block exposure method achieves a high-speed exposure with respect to regular or repeating patterns.

FIG. 5 shows an example of patterns of a plurality of blocks formed within one area of the stencil mask 20. FIG. 5 shows only four kinds of patterns, but the shapes of the repeating patterns are not so limited.

As described above, the block exposure method has an advantage in that the exposure of repeating patterns can be made at a high speed. However, not all LSI patterns can be exposed at a high speed using the block exposure method. Unless exactly the same pattern repeats, the high-speed exposure of the block exposure method cannot be realized because the irradiating position of the beam on the stencil mask 20 must be shifted from one area to another area which includes the desired patterns and this shift can only be made by moving the stencil mask 20. But it takes time to move and accurately position the stencil mask 20.

On the other hand, the contact holes of the ROM, for example, are regularly formed to a certain extent. However, the positions of the contact holes are not perfectly regular, and the contact holes cannot be formed by simply exposing exactly the same pattern repeatedly. As a result, it is necessary to move the stencil mask 20 so that the irradiating position of the beam on the stencil mask 20 is shifted from one area to another area which includes the desired patterns. Furthermore, when the number of areas which include similar but not identical patterns increases, it becomes necessary to change the stencil mask 20 to another different stencil mask in order to expose all of the desired patterns of an integrated circuit device because only a limited number of areas can be provided on the stencil mask 20. But it takes a considerably long time to change the old stencil mask and correctly position the new stencil mask.

There is also an exposure method which uses a blanking aperture array. The blanking aperture array includes apertures which are arranged two-dimensionally throughout the entire region of the blanking aperture array and each is provided with a corresponding pair of blanking electrodes. A voltage is applied across a pair of blanking electrodes of an aperture when the electron beam transmitted through this aperture is to be deflected outside an exposure region on a wafer. Hence, by controlling the supply of the voltage to each of the blanking aperture pairs of the blanking aperture array, it is possible to expose arbitrary fine patterns. An example of such an exposure method using the blanking aperture array is proposed in a Japanese Published Utility Model Application No. 56-19402.

For example, each square aperture of the blanking aperture array has a side of 7 μm, and the apertures are arranged with a pitch of 3 μm when exposing a square pattern having a side of 0.07 μm. The pitch is smaller than the side of the aperture so that patterns of the adjacent apertures are exposed on the wafer connect. In other words, the aperture itself is extremely small and the pitch with which the apertures are arranged is also extremely small, so that arbitrary patterns can be exposed with a high resolution. But because of the extremely small size and pitch of the apertures, it is very difficult technically, if not impossible, to form the necessary interconnections for the blanking electrode pairs on the blanking aperture array because of the extremely small pitch with which the apertures are arranged.

SUMMARY OF THE INVENTION

Accordingly, it is a general object of the present invention to provide a novel and useful stencil mask and charged particle beam exposure method and apparatus using the stencil mask, in which the problems described above are eliminated.

Another and more specific object of the present invention is to provide a stencil mask for use in exposing a pattern on a wafer using a charged particle beam which is transmitted through the stencil mask, comprising a plate, and at least a first block pattern region formed on the plate, where the first block pattern region includes apertures of arbitrary shapes for transmitting therethrough the charged particle beam which irradiates the apertures in one shot of the charged particle beam, and the first block pattern region forms a block mask in which a pair of confronting blanking electrodes is provided with respect to only predetermined ones of the apertures. According to the stencil mask of the present invention, it is possible to achieve high-speed exposure of patterns which are similar and regularly arranged because the same block pattern region can be used repeatedly.

Still another object of the present invention is to provide a stencil mask for use in exposing a pattern on a wafer using a charged particle beam which is transmitted through the stencil mask, comprising a plate, and at least a first block pattern region formed on the plate, where the first block pattern region includes apertures of arbitrary shapes for transmitting therethrough the charged particle beam which irradiates the apertures in one shot of the charged particle beam, the first block pattern region forms a block mask in which a pair of confronting blanking electrodes is provided with respect to each of the apertures, and the apertures within the first block pattern region are arranged with a predetermined pitch so that patterns of two adjacent apertures are isolated on the wafer.

A further object of the present invention is to provide a charged particle beam exposure method in which a charged particle beam is irradiated on an exposure region of a wafer via a stencil mask, where the stencil mask includes a plate and at least a first block pattern region formed on the plate, the first block pattern region includes apertures of arbitrary shapes for transmitting therethrough the charged particle beam which irradiates the apertures in one shot of the charged particle beam, and the first block pattern region forms a block mask in which a pair of confronting blanking electrodes is provided with respect to at least predetermined ones of the apertures, and the charged particle beam exposure method comprises the steps of (a) selectively irradiating the charged particle beam within one block pattern region of the stencil mask, and (b) applying a voltage across the pair of blanking electrodes of selected ones of the predetermined apertures within the first block pattern region depending on a desired pattern which is to be exposed on the wafer when the step (a) selectively irradiates the charged particle beam within the first block pattern region, so that the charged particle beam transmitted through each of the selected ones of the apertures is deflected outside the exposure region of the wafer. According to the charged particle beam exposure method of the present invention, a high-speed exposure of patterns, which are similar and regularly arranged, is achieved because the same block pattern region can be used repeatedly.

Another object of the present invention is to provide a charged particle beam exposure apparatus which irradiates a charged particle beam on an exposure region of a wafer via a stencil mask, where the stencil mask includes a plate and at least a first block pattern region formed on the plate, the first block pattern region includes apertures of arbitrary shapes for transmitting therethrough the charged particle beam which irradiates the apertures within the first block pattern region in one shot of the charged particle beam, and the first block pattern region forms a block mask in which a pair of confronting blanking electrodes is provided with respect to at least predetermined ones of the apertures, and the charged particle beam exposure apparatus comprises first means for generating the charged particle beam, second means for selectively irradiating the charged particle beam within one block pattern region of the stencil mask, and third means for applying a voltage across the pair of blanking electrodes of selected ones of the predetermined apertures within the first block pattern region depending on a desired pattern which is to be exposed on the wafer when the second means selectively irradiates the charged particle beam within the first block pattern region, so that the charged particle beam transmitted through each of the selected ones of the apertures is deflected outside the exposure region of the wafer. According to the charged particle beam exposure apparatus of the present invention, a high-speed exposure of patterns, which are similar and regularly arranged, is achieved because the same block pattern region can be used repeatedly.

Other objects and further features of the present invention will be apparent from the following detailed description when read in conjunction with the accompanying drawings.

DESCRIPTION OF THE PREFERRED EMBODIMENTS

Figure 6A:
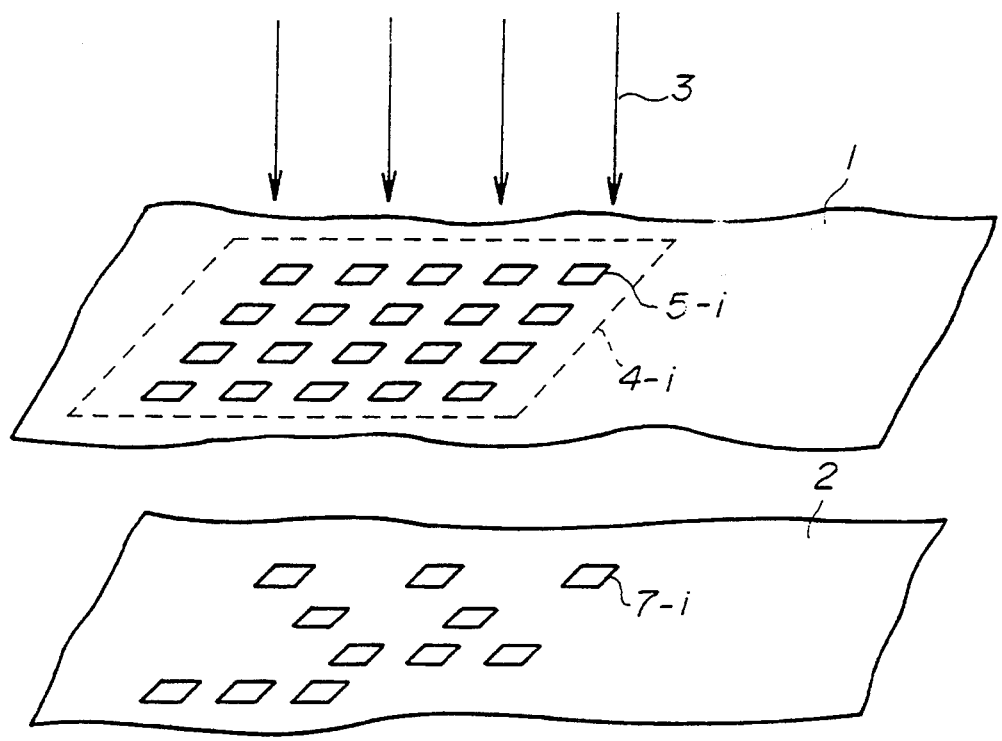
FIGS. 6A and 6B respectively are a perspective view and a plan view for explaining an operating principle of the present invention.

First, a description will be given of an operating principle of the present invention by referring to FIGS. 6A and 6B. FIG. 6A is a perspective view for explaining an exposure operation using a charged particle beam, and FIG. 6B is a plan view showing an aperture part of a stencil mask shown in FIG. 6A.

In FIG. 6A, a plurality of block pattern regions represented by a single region 4-i is formed in a stencil mask 1, and a plurality of apertures 5-i is regularly arranged within each block pattern region 4-i.

Figure 6B:
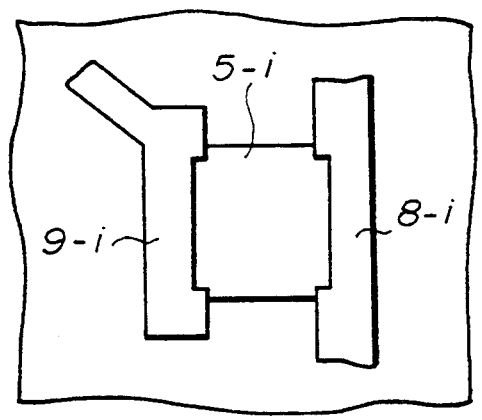

As shown in FIG. 6B, each aperture 5-i has a pair of blanking electrodes 8-i and 9-i. When a blanking voltage is applied across the blanking electrodes 8-i and 9-i of the aperture 5-i, the charged particle beam transmitted through the aperture 5-i is deflected outside an exposure region on a wafer which is to be exposed.

A predetermined voltage is applied to the blanking electrodes 8-i and 9-i of selected ones of the apertures 5-i within the block pattern region 4-i depending on the pattern which is to be exposed. When a charged particle beam 3 is irradiated within the block pattern region 4-i in this state, the apertures 5-i selectively transmit the charged particle beam 3 depending on whether or not the predetermined voltage is applied to the blanking electrodes 8-i and 9-i thereof. An exposure pattern 7 is formed on a wafer 2, depending on the selected apertures 5-i respectively having the blanking electrodes 8-i and 9-i to which are applied with the predetermined voltage the charged particle beam 3 selectively transmitted through each remaining aperture 5-i of the block pattern region 4-i thereby being irradiated on the wafer 2. The exposure pattern 7 corresponds to the apertures 5-i within the block pattern region 4-i, and the application of the predetermined voltage determines which of the apertures 5-i are exposed.

At least one block pattern region 4-i of the stencil mask 1 includes a plurality of apertures 5-i for forming independent patterns 7 on the wafer 2 when irradiated with the charged particle beam 3, where all of the apertures 5-i are preferably provided with the blanking electrodes 8-i and 9-i.

By regularly distributing the apertures 5-i within at least one block pattern region 4-i of the stencil mask 1, it becomes possible to selectively expose patterns which are regular to a certain extent. In addition, by providing the blanking electrodes 8-i and 9-i on all the apertures 5-i, it becomes possible to freely select which apertures 5-i are to transmit or block the charged particle beam 3, thereby enabling the exposure of arbitrary patterns.

Hence, the present invention is particularly effective when exposing patterns which are not identical but are regular and similar to a certain extent. In other words, it is possible to simultaneously expose patterns over a relatively large range by selecting a voltage pattern to be applied to the blanking electrodes 8-i and 9-i of the apertures 5-i, and the time required to expose the patterns can be reduced when compared to the conventional block exposure method which must irradiate the beam on a selected different block pattern region in order to expose a similar but different pattern.

Of course, the apertures 5-i within the block pattern region 4-i which are provided with the blanking electrodes 8-i and 9-i need not necessarily be arranged regularly if the same arrangement of the apertures 5-i may be used in common for exposing two or more different patterns.

Figure 7:
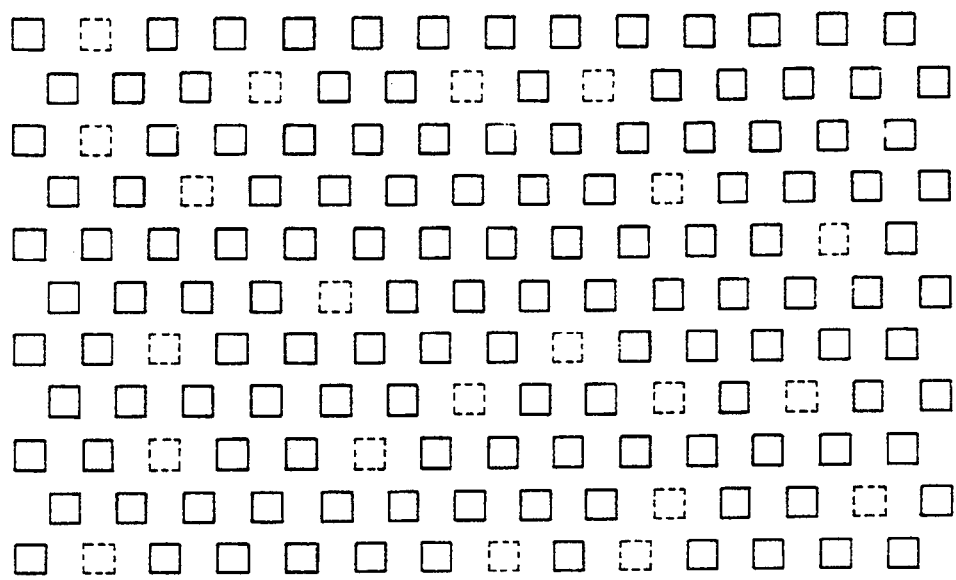
FIG. 7 is a plan view showing a mask ROM pattern.

FIG. 7 shows a mask ROM pattern. In a mask ROM, the positions where a contact may be made are regularly determined beforehand, but the actual contact positions depend on the information to be stored in the mask ROM. For example, the rectangular marks indicated by a dotted line in FIG. 7 indicate the positions where no contact is made. These positions where no contact is made vary arbitrarily depending on the information which is to be stored in the mask ROM. For this reason, such patterns which arbitrarily vary cannot be formed by repeatedly exposing the same pattern by the conventional block exposure method. If the block exposure method were to be applied in this case, a plurality of kinds of blocks corresponding to the entire exposure region would have to be prepared.

Figure 8:
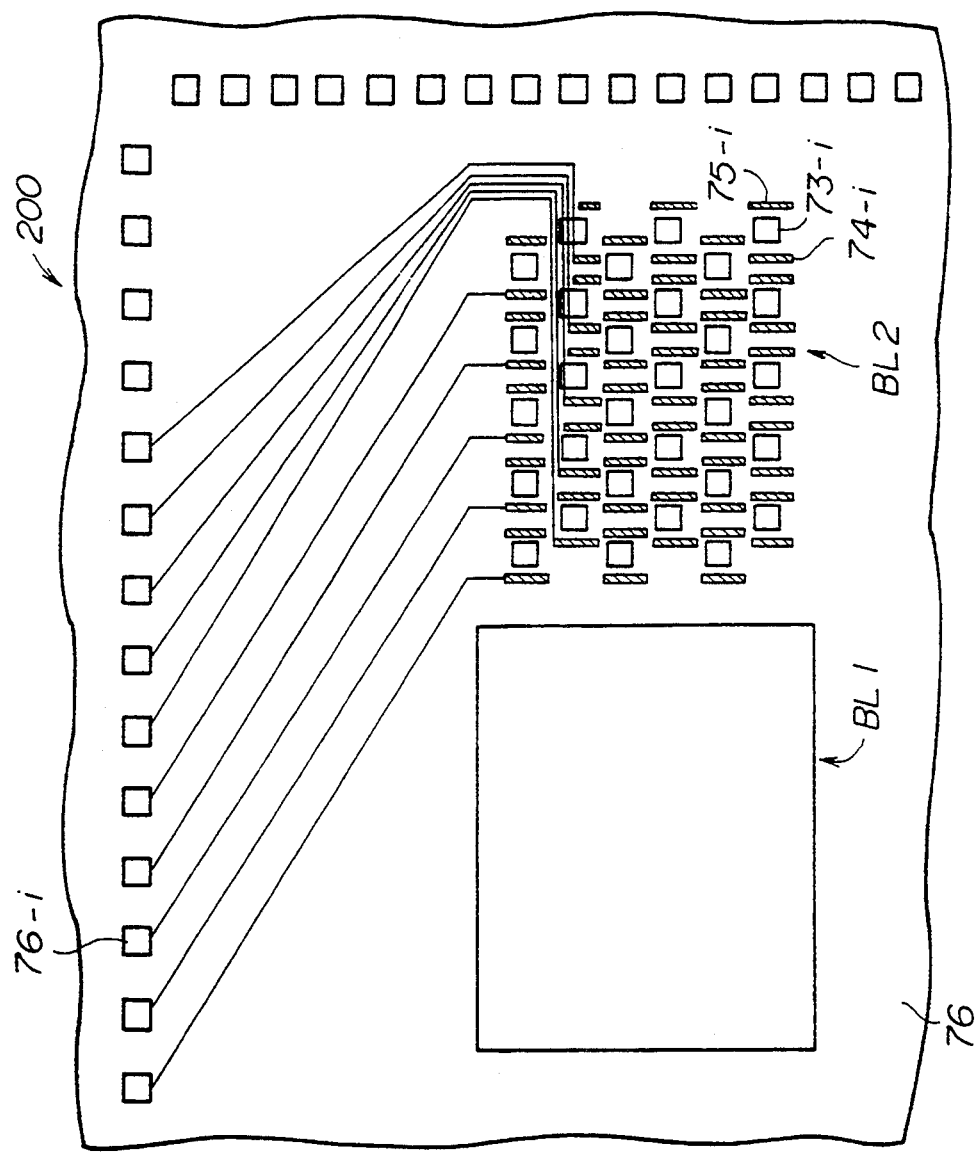
FIG. 8 is a plan view showing an essential part of a first embodiment of a stencil mask according to the present invention.

FIG. 8 shows an essential part of a first embodiment of a stencil mask according to the present invention. In this embodiment, the stencil mask will be referred to as a blanking block mask 200 so as to distinguish this embodiment from the conventional stencil mask 20.

In FIG. 8, a block pattern BL1 includes rectangular apertures for exposing variable rectangular patterns or for exposing repeating patterns, for example. A block pattern BL2 is located adjacent to the block pattern BL1. This block pattern BL2 is a block mask which is provided with blanking electrodes 74-i and 75-i and is used for exposing patterns of the mask ROM shown in FIG. 7, for example. When all apertures 73-i of the block mask BL2 are turned ON by applying no voltage to the blanking electrodes 74-i and 75-i and a charged particle beam is transmitted through the apertures 73-i of the block mask BL2, all of the contact positions of the mask ROM shown in FIG. 7 are exposed.

When a predetermined voltage is applied across the blanking electrodes 74-i and 75-i of selected ones of the apertures 73-i, the charged particle beam which is transmitted through the selected apertures 73-i is deflected outside the exposure region on the wafer and will not irradiate the exposure region. In other words, by applying the predetermined voltage across the blanking electrodes 74-i and 75-i of selected ones of the apertures 73-i depending on the pattern which is to be exposed on the wafer, it is possible to expose arbitrary contact patterns on the wafer using the same block mask BL2.

Figure 9:
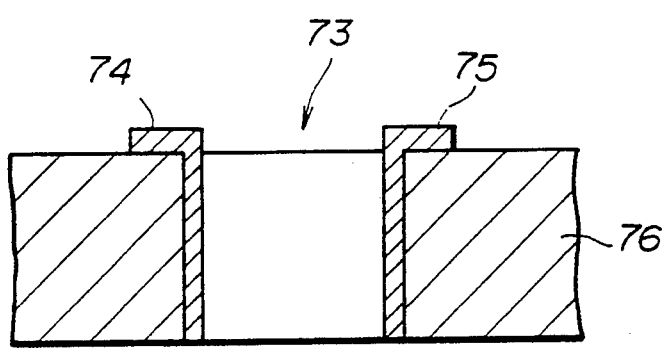
FIG. 9 is a cross sectional view showing the first embodiment in the vicinity of blanking electrodes of one aperture.

FIG. 9 generally shows the structure of the blanking block mask 200 in a vicinity of the blanking electrodes 74 and 75 of one aperture 73. The aperture 73 is formed in a thin plate part 76 which is made of a silicon wafer, for example, and the blanking electrodes 74 and 75 are formed on the confronting sides of the plate part 76 which define the aperture 73. For example, the blanking electrode 75 is connected to a ground potential, while the blanking electrode 74 is connected either to the ground potential or to a predetermined potential V depending on the exposure pattern. When the ground potential is applied to the blanking electrode 74, the confronting blanking electrodes 74 and 75 have the same potential and the incident charged particle beam is transmitted through the aperture 73 as it is (i.e., without being deflected) On the other hand, when the predetermined potential V is applied to the blanking electrode 74, the incident charged particle beam transmitted through the aperture 73 is deflected outside the exposure region of the wafer.

The blanking electrodes 74-i of the blanking block mask 200 are electrically coupled to pads 76-i which are provided on the peripheral part of the blanking block mask 200 as shown in FIG. 8. Hence, the predetermined potential V can be applied to the selected blanking electrodes 74-i via the pads 76-i depending on the exposure pattern.

In this embodiment, the blanking electrodes 74-i and 75-i are only provided within the block mask (block pattern) BL2 and not within the block pattern BL1. In addition, the block pattern BL1 includes rectangular apertures for exposing variable rectangular patterns or for exposing repeating patterns, for example. For this reason, it is possible to selectively use the block patterns BL1 and BL2 in order to expose desired patterns on the wafer. Of course, block patterns other than the block patterns BL1 and BL2 may be provided on the blanking block mask 200, and more than one block pattern may be provided with corresponding blanking electrodes 74-i and 75-i.

Figure 1:
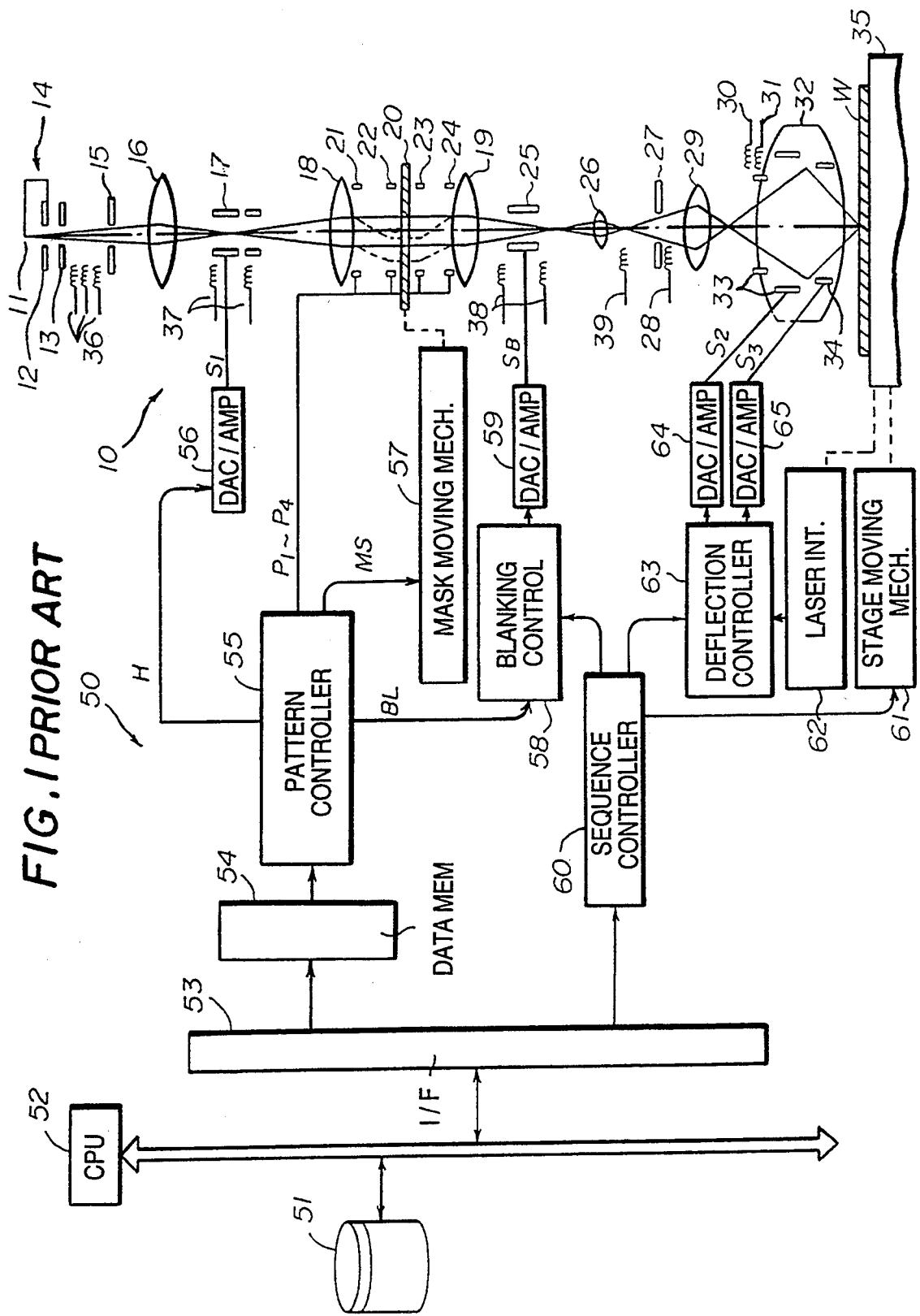
FIG. 1 is a system block diagram generally showing an example of an electron beam exposure apparatus.
Figure 2:
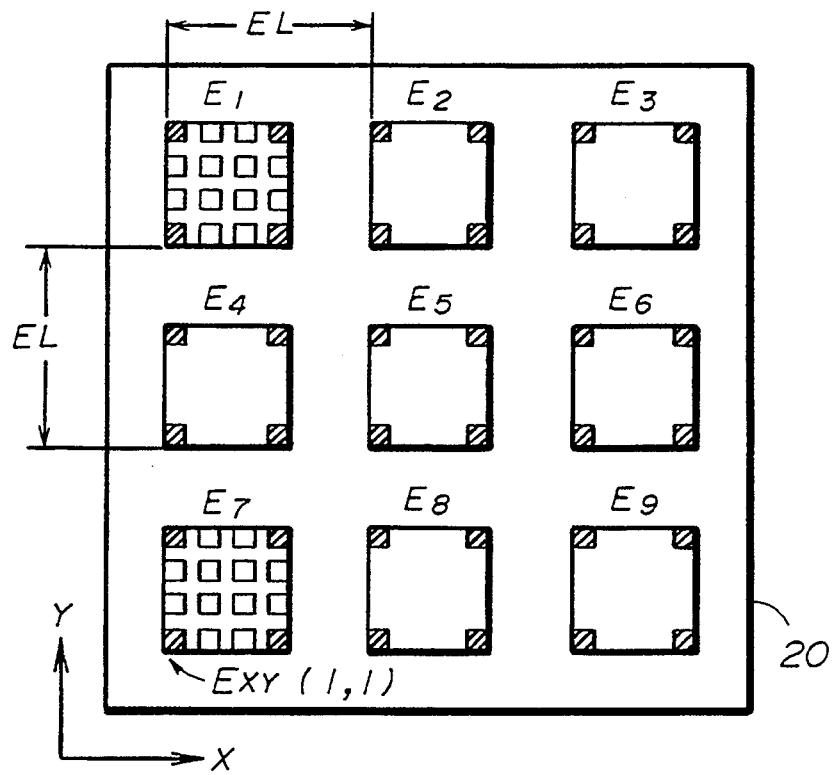
FIG. 2 is a plan view showing an example of a stencil mask.
Figure 3:
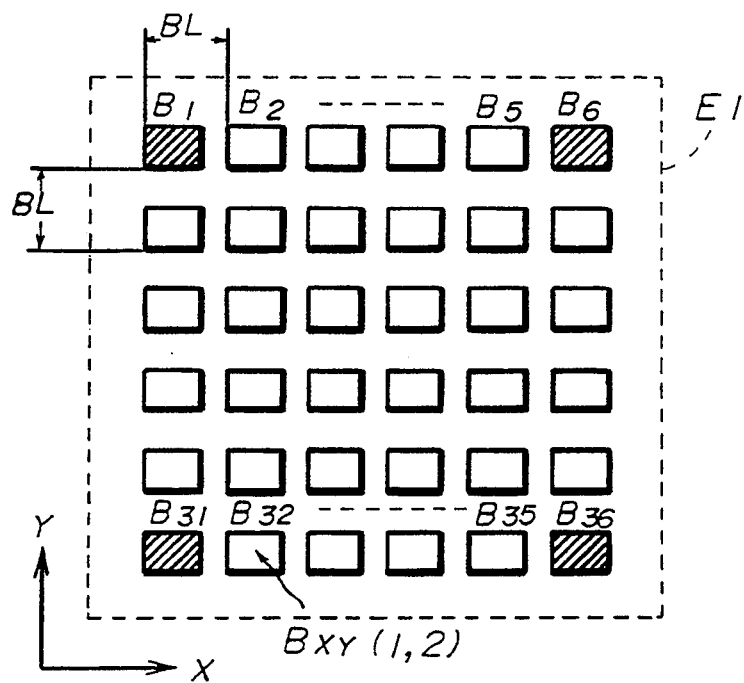
FIG. 3 is a plan view showing one area of the stencil mask shown in FIG. 2.
Figure 4:
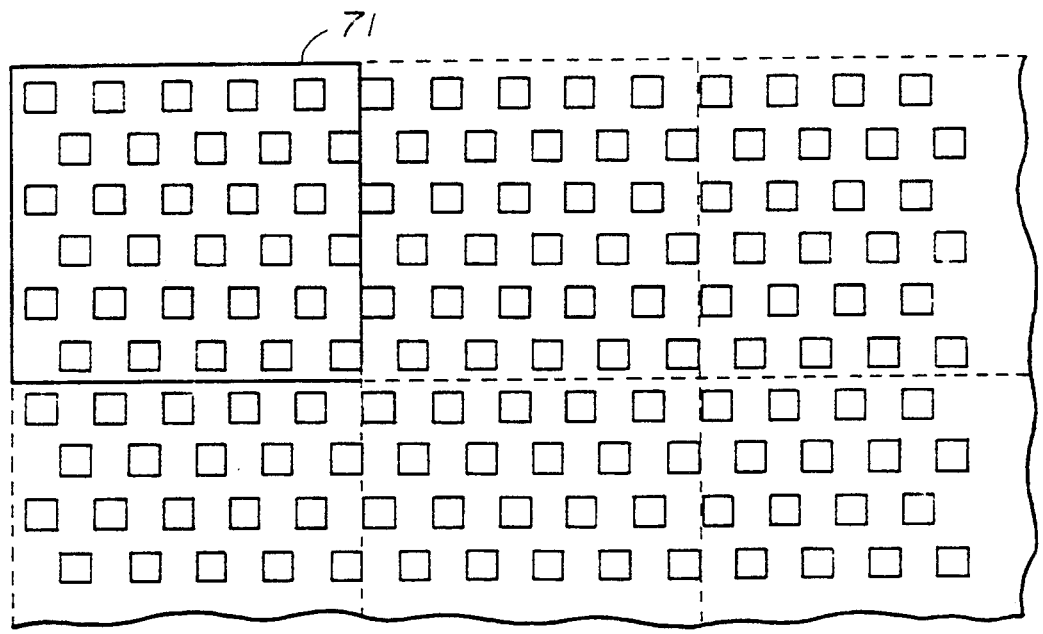
FIG. 4 is a plan view showing contact hole patterns of a DRAM.
Figure 5:
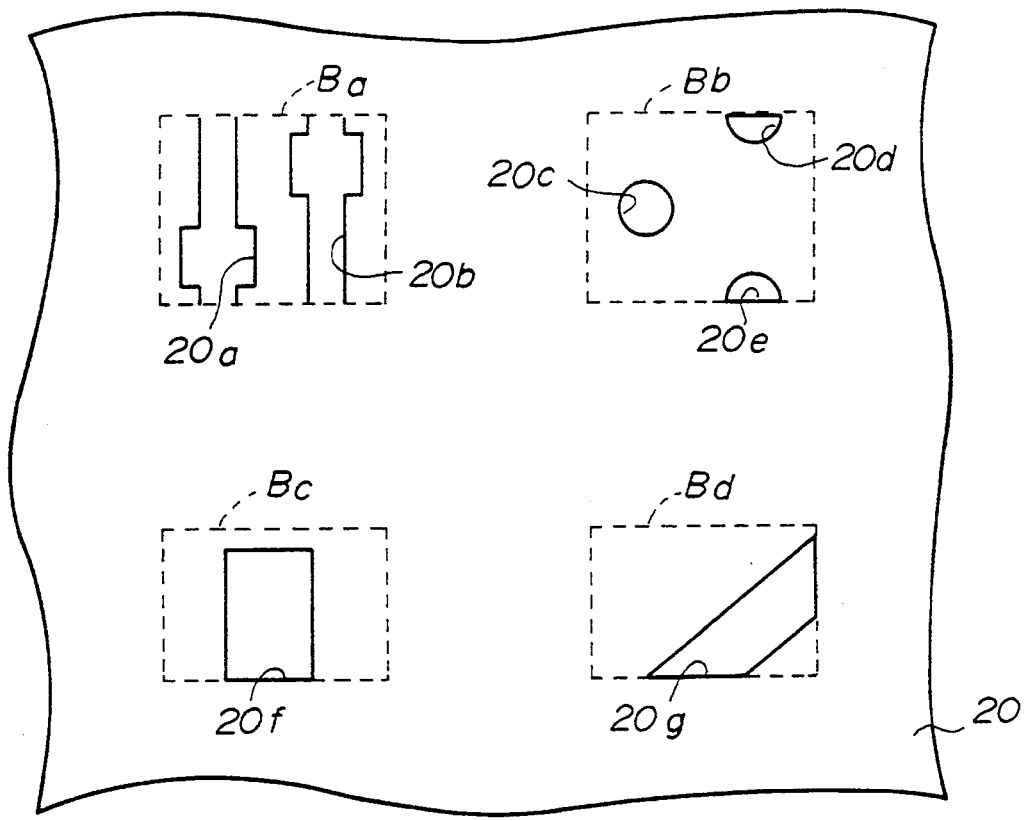
FIG. 5 is a plan view showing an example of patterns of a plurality of blocks of the stencil mask.
Figure 10:
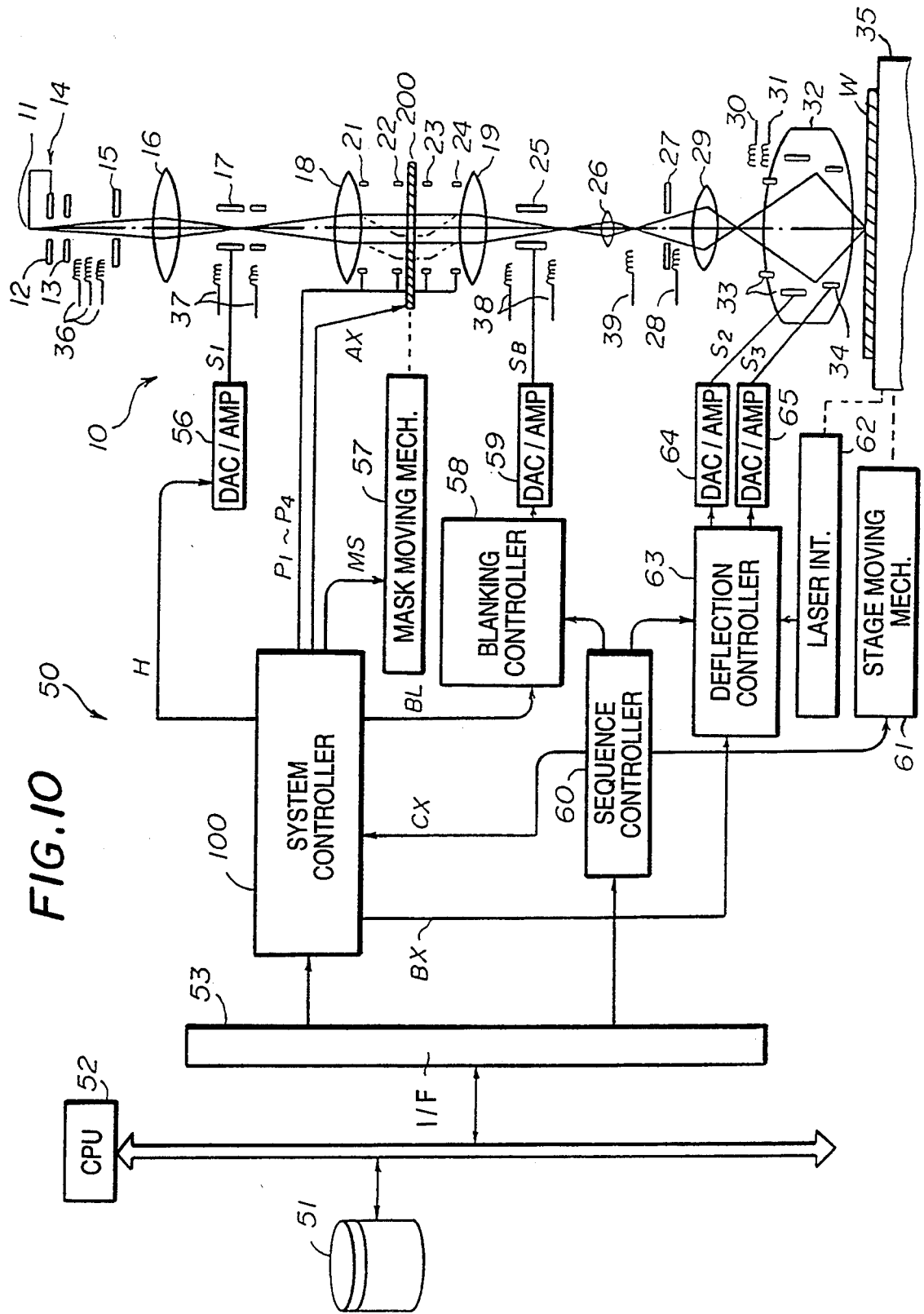
FIG. 10 is a system block diagram generally showing an embodiment of a charged particle beam exposure apparatus according to the present invention.

Next, a description will be given of an embodiment of a charged particle beam exposure apparatus according to the present invention, by referring to FIG. 10. This embodiment of the charged particle beam exposure apparatus employs an embodiment of a charged particle beam exposure method according to the present invention, that is, uses the blanking block mask 200 shown in FIG. 8. In FIG. 10, those parts which are the same as those corresponding parts in FIG. 1 are designated by the same reference numerals, and a description thereof will be omitted.

A system controller 100 shown in FIG. 10 includes a means for generating a predetermined voltage pattern to be applied to the blanking electrodes 74-i and 75-i of the selected apertures 73-i of the blanking block mask 200. The system 100 and parts related thereto are shown in FIG. 11.

Figure 11:
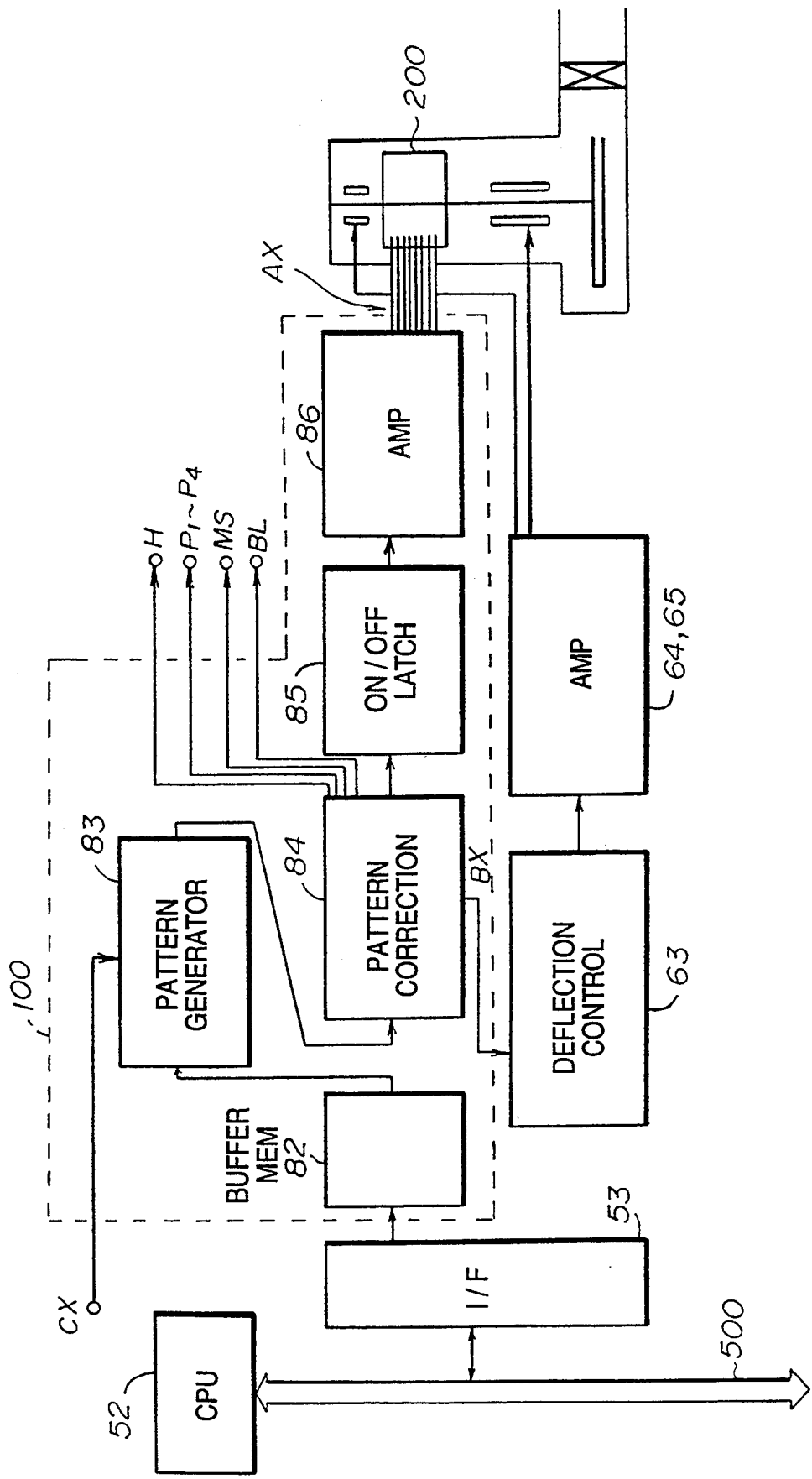
FIG. 11 is a system block diagram showing an essential part of the embodiment shown in FIG. 10.

As shown in FIG. 11, the system 100 includes a buffer memory 82, a pattern generator 83, a pattern correction circuit 84, an ON/OFF latch circuit 85 and an amplifier 86 which are connected as shown. The buffer memory 82 corresponds to the data memory 54 shown in FIG. 1 and is coupled to the CPU 52 via the interface 53 and a bus 500.

The CPU 52 supplies image information to the buffer memory 82 via the bus 500 and the interface 53 depending on pattern information, that is, the patterns to be exposed on the wafer W. The pattern generator 83 generates an exposure pattern based on the pattern information stored in the buffer memory 82 in response to a control signal CX which is received from the sequence controller 60. Hence, the exposure pattern which corresponds to one aperture and is to be exposed by each shot of the charged particle beam is supplied to the pattern correction circuit 84.

For example, the generated exposure pattern may need to be rotated by a certain angle depending on the positional error of the wafer W from an ideal wafer position. The pattern correction circuit 84 makes the necessary correction on the generated exposure pattern, and the corrected exposure pattern is supplied to an ON/OFF data latch circuit 85. In addition, the pattern correction circuit 84 generates the correction value H, the position information P1 through P4, the move signal MS, the blanking control signal BL and a deflection control signal BX. The deflection control signal BX is supplied to the deflection control circuit 63, so that the charged particle beam is irradiated within one block pattern of the blanking block mask 200.

The ON/OFF data latch circuit 85 receives information which is dependent on the exposure pattern to be formed on the wafer W. An output signal of the ON/OFF data latch circuit 85 indicates which blanking electrodes 74-i and 75-i are to receive the predetermined voltage, and the amplifier 86 amplifies the output signal of the ON/OFF data latch circuit 85. An output signal AX of the amplifier 86 is supplied to the pads 76-i of the blanking block mask 200.

Hence, the pattern generator 83, the pattern correction circuit 84, the ON/OFF latch circuit 85 and the amplifier 86 correspond to the pattern controller 55 shown in FIG. 1.

Next, a description will be given of second, third and fourth embodiments of the stencil mask according to the present invention, by referring to FIGS. 12A through 12C.

Figures 12A, 12B, 12C:
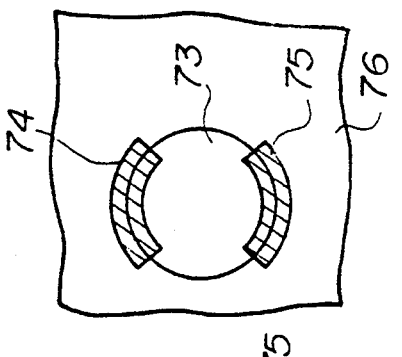
FIGS. 12A through 12C respectively are diagrams showing apertures of second, third and fourth embodiments of the stencil mask according to the present invention.

FIG. 12A shows one of a plurality of square apertures 73 which are formed in the second embodiment of the stencil mask. The blanking electrodes 74 and 75 are provided on the confronting sides of the walls defining the aperture 73.

FIG. 12B shows one of a plurality of rectangular apertures 73 which are formed in the third embodiment of the stencil mask. The blanking electrodes 74 and 75 are provided on the confronting longer sides of the walls defining the aperture 73.

FIG. 12C shows one of a plurality of circular apertures 73 which are formed in the fourth embodiment of the stencil mask. The blanking electrodes 74 and 75 are provided on the wall which defines the aperture 73 so as to confront each other.

Figure 13A:
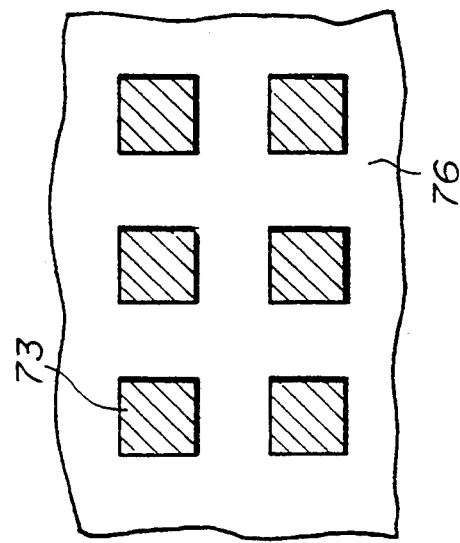
FIGS. 13A and 13B respectively are diagrams showing essential parts of fifth and sixth embodiments of the stencil mask according to the present invention.
Figure 13B:
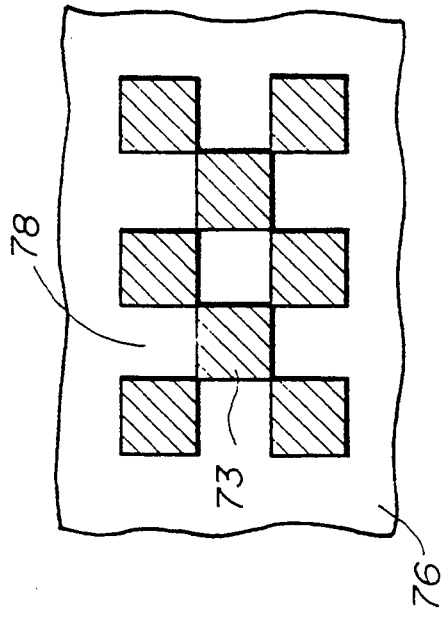

FIGS. 13A and 13B show essential parts of fifth and sixth embodiments of the stencil mask according to the present invention in which the apertures are arranged in an array.

In FIG. 13A, the apertures 73 are arranged in the form of a checker board pattern. A blocking part 78 is arranged between two mutually adjacent apertures 73 in the horizontal and vertical directions. Hence, the apertures 73 are successively arranged diagonally as shown. In this embodiment, one-half of the total area of the block pattern of the stencil mask is occupied by the apertures 73. As a result, it is possible to expose a relatively large area by repeating the exposure twice. In order to improve the mechanical strength of the stencil mask, each corner of the aperture 73 is preferably rounded.

In FIG. 13B, the apertures 73 are arranged with a predetermined pitch in the horizontal and vertical directions. In this embodiment, it is possible to expose a continuous stripe pattern by repeating the exposure twice in both the X and Y directions. Of course, adjacent rows or columns of the apertures 73 may be shifted by the predetermined pitch so that the apertures 73 are arranged diagonally with a certain pitch.

In the block patterns shown in FIGS. 13A and 13B, the respective shapes of the apertures 73 are of course not limited to the square shape.

Figure 14A:
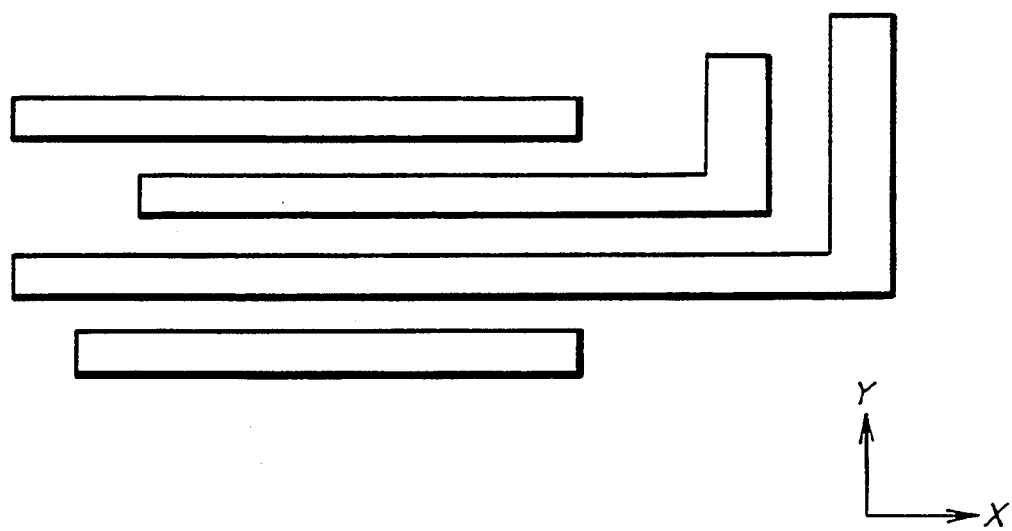
FIGS. 14A and 14B are diagrams for explaining interconnection patterns which may be formed by the present invention.
Figure 14B:
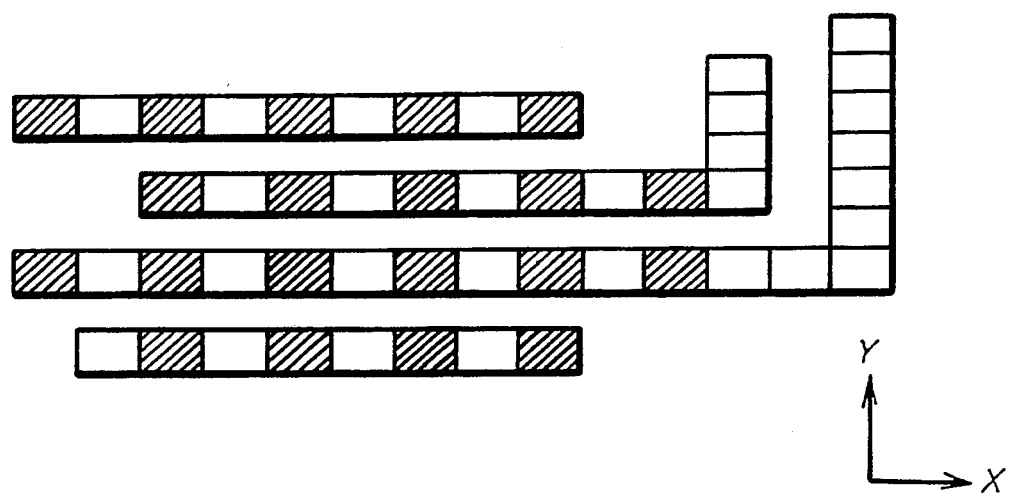

FIGS. 14A and 14B are diagrams for explaining the exposure of interconnection patterns and segmentation thereof.

FIG. 14A shows interconnection patterns within an integrated circuit device. The interconnection patterns themselves are not special, but such stripe patterns which extend in the X and Y directions are often used in integrated circuits. A description will now be given of the exposure of such interconnection patterns using the block pattern shown in FIG. 13B, for example.

FIG. 14B shows a method of segmenting the interconnection patterns shown in FIG. 14A when exposing the interconnection patterns using the block pattern shown in FIG. 13B. In FIG. 14B, each region indicated by the hatching corresponds to the region which can be exposed in one shot of the exposure using one aperture 73 of the block pattern shown in FIG. 13B. Since the apertures 73 in FIG. 13B are arranged with the predetermined pitch in both the X and Y directions, the hatched regions shown in FIG. 14B are exposed by applying the voltage to the blanking electrodes of the selected apertures 73. The regions on the left and right of the hatched regions can be exposed by deflecting the charged particle beam by one pitch in the X direction. For the regions which are located on the right side of the interconnection patterns, such regions can be exposed by aligning the apertures 73 to the region at the bottom right corner and making the exposures, once by shifting the exposure position by one pitch in the X direction and once by shifting the exposure position by one pitch in the Y direction. As a result of such exposure processes, all of the interconnection patterns shown in FIG. 14A can be exposed.

The size of a region which can be exposed on the wafer in one exposure process is determined by selecting the number of apertures within one block pattern depending on a region which can be exposed by the charged particle beam. Normally, a square region which can be exposed on the wafer in one shot of an electron beam has a side on the order of approximately 3 to 4 $\mu$m. On the stencil mask, this square region is magnified to 100 times, and the corresponding square region of the stencil mask has a side on the order of approximately 400 $\mu$m. In order to expose a desired region in its entirety, the exposure region is divided into block regions which can respectively be exposed in one exposure process, and thereafter, the division can be made within the patterns as in the case shown in FIG. 14B.

In DRAMs, the interconnection patterns have typical line widths depending on the types of DRAMs. For example, the typical line width of the interconnection patterns is approximately 1 $\mu$m for the 1 Mbit DRAM, approximately 0.7 $\mu$m for the 4 Mbit DRAM, approximately 0.5 $\mu$m for the 16 Mbit DRAM, and approximately 0.3 $\mu$m for the 64 Mbit DRAM. Hence, by matching the size and pitch of the aperture patterns to the typical line widths depending on the type of DRAM, it is possible to form a stencil mask having a block pattern which is suited for exposing the patterns of the particular type of DRAM.

When each side of the square apertures 73 is equal to the pitch with which the square apertures 73 are arranged as in the cases shown in FIGS. 13A and 13B, the block pattern is particularly suited for segmenting the exposure patterns to be exposed in a plurality of exposures.

The apertures of the stencil mask provided with the blanking electrodes are suited for exposing contact holes and interconnections of a gate array, exposing contact hole patterns of a ROM, and exposing interconnection patterns of microprocessor chips and various memory devices. Therefore, patterns of various kinds of integrated circuits can be exposed at a high speed.

FIGS. 15, 16, 17 and 18 respectively show apertures of seventh, eighth, ninth and tenth embodiments of the stencil mask according to the present invention.

Figure 15:
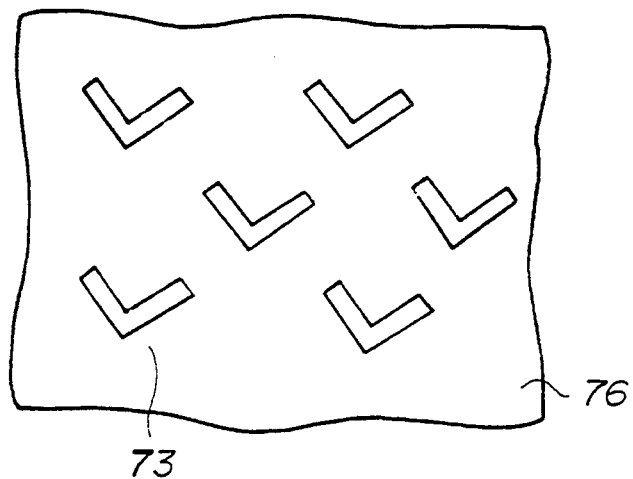
FIGS. 15, 16, 17 and 18 respectively are diagrams showing apertures of seventh, eighth, ninth and tenth embodiments of the stencil mask according to the present invention.

In FIG. 15, the apertures 73 have an approximate V-shape. These apertures 73 are suited for exposing gates of a DRAM, for example.

Figure 16:
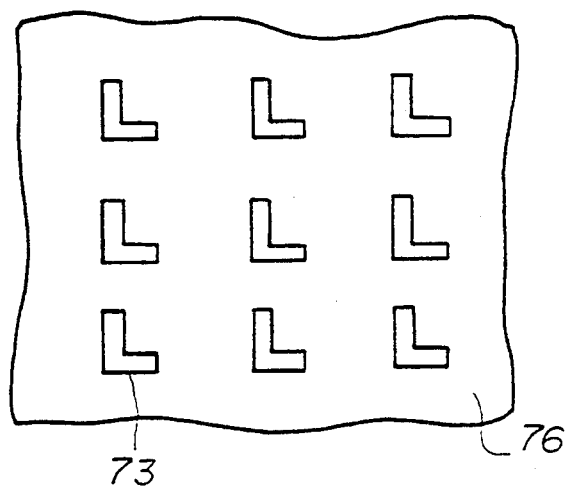

In FIG. 16, the apertures 73 have an approximate L-shape.

Figure 17:
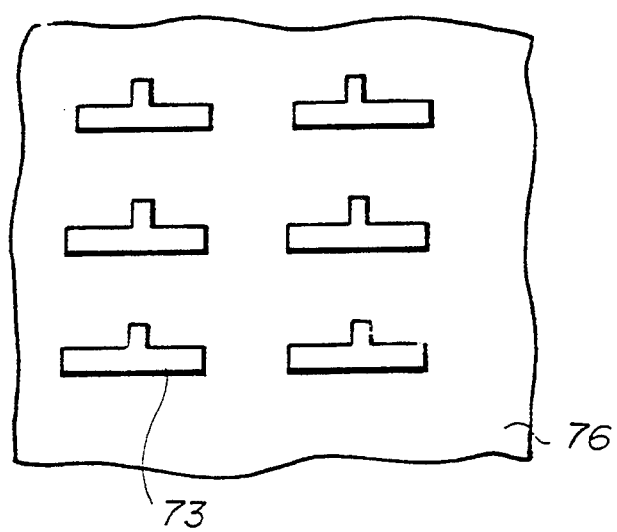

In FIG. 17, the apertures 73 have an approximate upsidedown T-shape.

Figure 18:
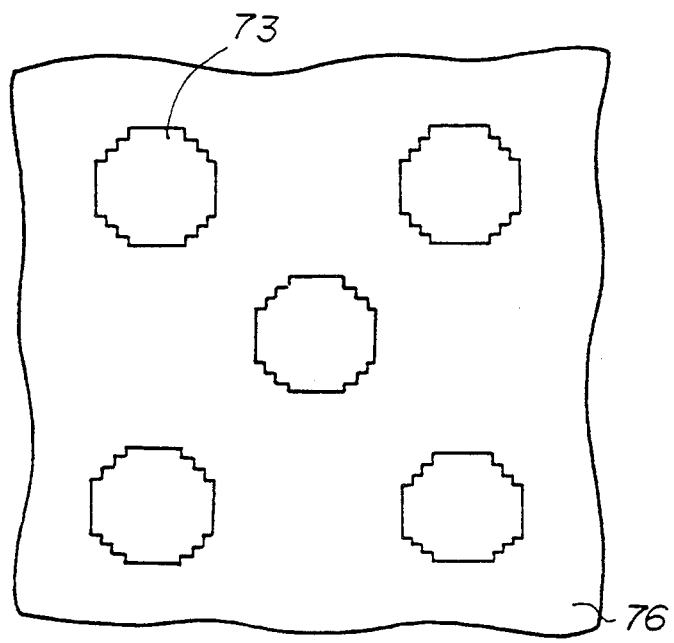

In FIG. 18, the apertures 73 have an approximate octagonal shape.

The stencil mask according to the present invention is quite different from the conventional blanking aperture array, in that the blanking electrodes are only provided for the apertures within one or more selected block patterns (or block pattern regions) in the present invention in the conventional array, while the blanking electrodes are provided for all the apertures of the blanking aperture array. In addition, when forming a square pattern having a side of 0.2 $\mu$m on the wafer, for example, the apertures which are formed within the block pattern of the stencil mask of the present invention and provided with the blanking electrodes have a side of 20 $\mu$m and are arranged with a pitch of 80 $\mu$m. In the present invention, the pitch of the apertures in a specific direction in which the apertures are arranged is greater than or equal to the length of each aperture along the specific direction because each aperture is used for exposing a certain area of the desired pattern, while each aperture of the blanking aperture array is used for exposing a dot of the desired pattern. The specific direction may be the X and/or Y direction referred above. Hence, the required interconnections for the blanking electrodes can be formed with ease on the stencil mask according to the present invention, and particularly because the blanking electrodes are provided for the apertures within only the selected block patterns (or block pattern regions).

Further, the present invention is not limited to these embodiments, but various variations and modifications may be made without departing from the scope of the present invention.

What is claimed is:

1. A charged particle beam exposure apparatus which irradiates a charged particle beam on an exposure region of a wafer via a stencil mask, said charged particle beam exposure apparatus comprising: first means for generating the charged particle beam; the stencil mask comprising:

a plate, at least a first block pattern region formed on said plate, each said block pattern region forming a block mask and including corresponding apertures of arbitrary shapes for transmitting therethrough the charged particle beam, when irradiated thereon and in one shot of the charged particle beam, and a corresponding pair of confronting blanking electrodes disposed in each of the apertures, said corresponding apertures within each said block pattern region being arranged with a predetermined pitch so that patterns of two adjacent apertures of a corresponding block pattern region are isolated on the wafer;

second means for irradiating a selected block pattern region of the stencil mask with the charged particle beam; and third means for selectively applying a voltage across each of the corresponding pairs of blanking electrodes of selected ones of the predetermined apertures within the selected block pattern region corresponding to a desired pattern which is to be exposed on the wafer when said second means irradiates the selected block pattern region with the charged particle beam, so that the charged particle beam, as selectively transmitted through the selected ones of the apertures, is deflected outside the exposure region of the wafer and, as selectively transmitted through the remaining, not selected apertures, irradiates the corresponding, isolated patterns thereof on the exposure region of the wafer.

2. The charged particle beam exposure apparatus as claimed in claim 1, further comprising:

control means for controlling said first, second and third means to perform at least first and second successive exposure processes utilizing the selected block pattern region of the stencil mask, including controlling said third means, in advance of and during the first exposure process, for selectively applying the voltage across each of the corresponding pairs of blanking electrodes of a first set of selected, predetermined apertures and, in advance of and during the second exposure process, for selectively applying the voltage across each of the corresponding pairs of blanking electrodes of a second set of selected predetermined apertures different from the first set thereof.

3. The charged particle beam exposure apparatus as claimed in claim 2, wherein the desired pattern is selected from the group consisting of contact hole patterns and interconnection patterns, each of an integrated circuit.

4. The charged particle beam exposure apparatus as claimed in claim 3, wherein the desired pattern is divided into a plurality of parts, and the apertures within the at least a first block pattern region of the stencil mask correspond to at least one of the divided parts of the desired pattern.

5. The charged particle beam exposure apparatus as claimed in claim 4, which further comprises fourth means for deflecting the charged particle beam by a predetermined distance on the wafer during one of the first and second exposure processes so that the desired pattern becomes continuous on the wafer after completion of the first and second exposure processes.

* * * * *

UNITED STATES PATENT AND TRADEMARK OFFICE
CERTIFICATE OF CORRECTION

PATENT NO. : 5,376,802
DATED : December 27, 1994
INVENTOR(S) : Kiichi SAKAMOTO, et al.

It is certified that error appears in the above-indentified patent and that said Letters Patent is hereby corrected as shown below:

Title Page, at [54], line 1, delete "CHARGE" and insert therefor --CHARGED--.
Col. 1, line 1, delete "CHARGE" and insert therefor --CHARGED--;
    Line 8, delete "5,885,000" and insert therefor --5,288,567--.
Col. 3, line 20, after "EL", insert --in each of the X- and Y-directions, or coordinates--;
    Lines 21 and 22, delete "in each of the X- and Y-directions, or coordinates".
Col. 4, line 4, after "times", insert a comma (",");
    Line 36, after "another", insert a comma (",").
Col. 5, line 28, delete "still" and insert therefor --Still--.
Col. 12, line 27, after "tion", delete "in the conventional array";
    Line 27, after "while", insert --in the conventional array,--.

Signed and Sealed this

Fourteenth Day of March, 1995

Attest:

BRUCE LEHMAN

*Attesting Officer*     *Commissioner of Patents and Trademarks*